United States Patent [19]
Joshi et al.

[11] Patent Number: 5,387,796
[45] Date of Patent: Feb. 7, 1995

[54] LOW LEAKAGE CURRENT PHOTODETECTOR ARRAYS

[75] Inventors: Abhay M. Joshi, Plainsboro; Krishna R. Linga, Harrison, both of N.J.

[73] Assignee: Epitaxx, Inc., West Trenton, N.J.

[21] Appl. No.: 68,446

[22] Filed: May 26, 1993

[51] Int. Cl.$^6$ ................. H01L 21/365; H01L 21/477
[52] U.S. Cl. ................................. 250/370.12; 257/190
[58] Field of Search ............... 250/370.12; 257/191, 257/190

[56] References Cited

FOREIGN PATENT DOCUMENTS 53-13378 2/1978 Japan ............................... 257/190

OTHER PUBLICATIONS

M. C. Boissy, D. Digue, J. Hallais and C. Schemali, "An efficient GaInAs photodiode for near–infrared detection." Proceedings of the 6th International Symposium on Gallium Arsenide and Related Compounds, Edinburgh, Scotland (20–22 Sep. 1976) [Inst. Phys. Conf. Ser. No. 33a © 1977] pp. 427–436.
"512 and 1024 Element Linear InGaAs Detector . . . Sensing", Joshi et al, SPIE Con Jul. 1992 Arrays for Near Infrared.
Near Infrared InGaAs Detectors and Arrays . . . : Joshi et al.
"Current Status of InGaAs Detector Arrays . . . " Olsen et al SPIE 1540, 1991.
"Room Temperature Detectors . . . ", Ban et al, SPIE vol. 1106, 1989.
"Buttable Arrays of 300 Multiplexed . . . " Moy et al, SPIE vol. 686, 1986.
Defects and Defect Reduction . . . Sharan et al, J. Electronic Materials, vol. 20 No. 2, 1991.

Primary Examiner—Constantine Hannaher
Attorney, Agent, or Firm—Birgit E. Morris

[57] ABSTRACT

Leakage current in InGaAs/InAsP/InP lattice mismatched photodetectors can be reduced by providing graded InAsP compositions having abrupt interfaces between successive layers that maintain a lattice mismatch between the layers of 0.13% or less; doping the absorption layer with high levels of sulfur and by thermal cycling of the wafers. High yields of low leakage current photodetector arrays are obtained.

15 Claims, 6 Drawing Sheets

LOW LEAKAGE CURRENT PHOTODETECTOR ARRAYS

This invention relates to low leakage current photodetectors. More particularly, this invention relates to low leakage current InGaAs/InAsP/InP photodetectors and method of making them.

BACKGROUND OF THE INVENTION $In_{0.53}Ga_{0.47}As$/InP photodetectors are known for the 1.0–1.7 micron region of the spectrum for fiber optic and instrumental applications. These standard lattice matched photodetectors are illustrated in FIG. 1. An InP substrate wafer 12 has a buffer layer of n-InP 14 formed thereon. An active layer of n-$In_{0.53}Ga_{0.47}As$ 16 is deposited using vapor phase epitaxy (VPE) techniques. A cap layer 18 of n-InP is deposited over the active layer 16 and a final silicon nitride passivation layer 20 is deposited thereover. Zinc is diffused through the cap layer 18 into the active layer 16 to create a p-n junction 22 therein. A bilevel Au—Zn/Ti—Pt—Au 24 contact is deposited as the anode. The InP substrate 12 is then lapped and polished and a final Au—Sn electrode 26 is deposited as the other electrode.

More recently, with the advent of optical fibers that operate at about 2.5 microns, in order to extend the spectral range of these photodetectors beyond 1.7 microns, photodetectors having graded compositional layers of $In_xGa_{1-x}As$ have been suggested. These arrays extend their range of spectral response for these photodetectors out to about 3 microns. By adjusting the composition of the active InGaAs layer, photodetectors having varying spectral response can be made, such as a cutoff wavelength of 1.7 microns (wherein x=0.53, $E_g$=0.73eV); 2.2 microns (wherein x=0.71, $E_g$=0.56eV); and 2.6 microns (wherein x=0.82, $E_g$=0.47eV) using hydride vapor phase epitaxy (VPE) techniques. Arrays of these photodetectors having pixel sizes of 13×500 microns have a center-to-center spacing of 25 microns. Such arrays are useful for example, for satellite projects such as Scanning Imaging Absorption Spectrometer Atmospheric Chartography (SCIAMACHY) which monitors constituents in the upper atmosphere, including ozone, water, methane, carbon monoxide and carbon dioxide. By tailoring the various constituents of the detectors, the peak responsivity can detect various of these constituents located at different wavelengths in the light spectrum.

The biggest drawback of these current photodetector arrays is that they are lattice mismatched devices with high leakage current. Limiting the amount of leakage current in the photodetectors is important because high leakage current limits the signal to noise ratio required to detect atmospheric constituents. Optimally leakage currents on the order of 7fA @ 150K and a reverse bias of about 10 mV for a 2.6 micron cutoff wavelength array would be highly desirable. However, such levels are unknown at present.

It is known that lattice mismatch between successive, compositionally different, InGaAs layers creates dislocations in the grown layers. The dislocations are electrically active as generation-recombination centers. This lattice mismatch contributes to leakage current in InGaAs photodetectors, and a reduction in the number of dislocations will result in improved device performance.

If leakage currents of InGaAs photodetectors can be decreased, their sensitivity, yield and signal to noise ratio would be increased. Thus it would be highly desirable to be able to produce InGaAs photodetectors with lower leakage current.

SUMMARY OF THE INVENTION

We have found that leakage current in InGaAs/InAsP/InP lattice mismatched photodetectors can be reduced by following certain manufacturing criteria;

a) growing successive $InAs_yP_{1-y}$ layers over an InP substrate having differing graded compositions (varying the amount of "y") having very abrupt interfaces between the layers, maintaining a lattice mismatch between successive layers of 0.13% or less to reduce dislocation density;

b) doping the active (absorption) InGaAs layer with sulfur (S) up to $1-5 \times 10^{17}$ cm$^{-3}$; and c) thermal annealing the grown wafers by thermal cycling.

The $InAs_yP_{1-y}$ graded layers also can be doped with sulfur up to $1-5 \times 10^{18}$ cm$^{-3}$.

By following the above criteria, the resultant InGaAs/InAsP/InP arrays can be manufactured with high yields of low leakage current photodetector arrays.

DETAILED DESCRIPTION OF THE INVENTION

The present $In_xGa_{1-x}As$ photodetectors are grown onto InP substrates. A typical photodetector of the invention is shown in FIG. 2.

Figure 1:
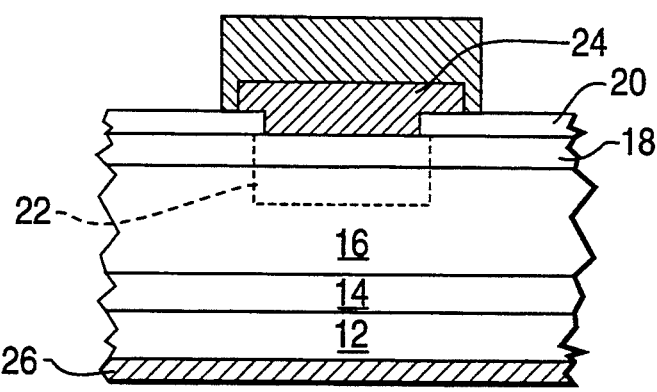
FIG. 1 is a cross sectional view of a standard InGaAs/InP photodetector of the prior art.
Figure 2:
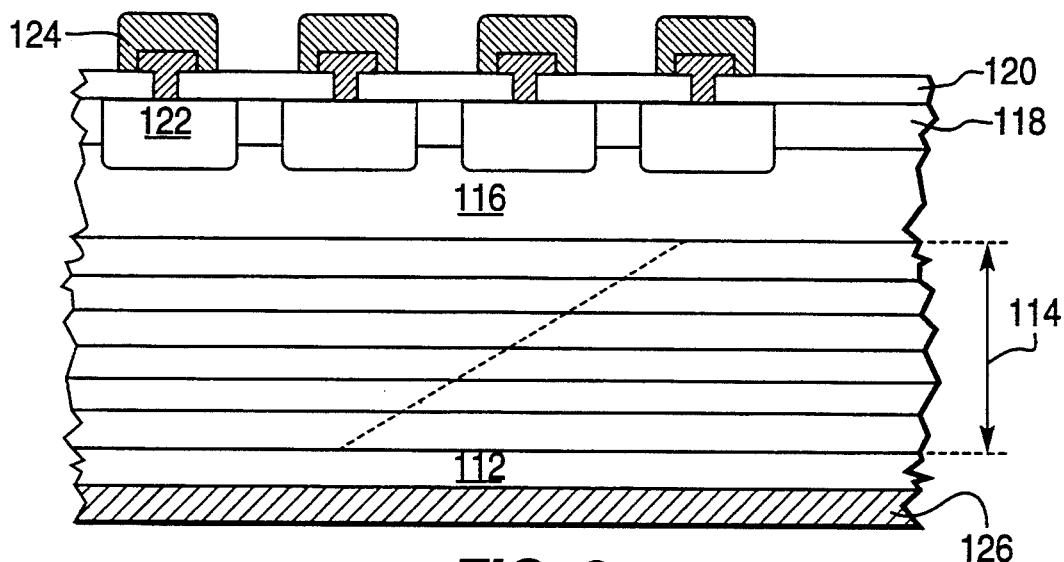
FIG. 2 is a cross sectional view of a graded 2.2 micron InGaAs/InAsP/InP photodetector of the invention.

Referring to FIG. 2, an n+ InP substrate 112 has a series of compositionally graded $InAs_yP_{1-y}$ layers 114 deposited thereon in accordance with the principles of the present invention. An active layer of $In_xGa_{1-x}As$ 116 is deposited onto the InAsP layers 114. A cap layer of $InAs_yP_{1-y}$ 118 is deposited over the active layer 116 and a silicon nitride passivating layer 120 is deposited over the cap layer. p-n Junctions 122 are made by zinc diffusion and a bi-level AuZn/Ti—Pt—Au contact 124 is formed thereover. A second electrode 126 is made of $Au_{0.8}Sn_{0.2}$ onto the previously lapped and polished InP substrate 112.

In a lattice mismatched device, the lattice constant of the InGaAs absorption layer is not the same as that of the InP substrate. The InGaAs photodetectors for 2.2 and 2.6 micron cutoff arrays have lattice constants of 5.94 and 5.98 angstroms respectively, whereas the lattice constant of an InP substrate is 5.87 angstroms. Thus there is a substantial lattice constant mismatch for these arrays.

It is known to vary the composition of the InGaAs across the absorption layer by building up a sequence of layers, each having a different composition and each also having a different lattice constant.

In the present arrays, a series of compositionally different InAsP layers is deposited over an InP substrate to reduce the lattice mismatch between the substrate and the absorption layer. We have found that lattice mismatch can be reduced firstly by depositing the layers so that there is a very abrupt interface between the layers. Abrupt interfaces between the layers can be maintained by careful regulation of the precursor gas stream.

Secondly, the lattice constant difference between each of the successive layers must be maintained at a very small level, at about 0.13% or less, and preferably at about 0.10% or less. The number of InAsP layers to be deposited will depend on the total amount of the mismatch between the InP substrate and the InGaAs absorption layer which must be compensated for.

Following these precepts, photodetector arrays having reduced leakage current can be obtained.

Leakage current can be further improved by doping the InGaAs absorption layer with moderate levels of sulfur. Table I below illustrates the variation of leakage current and capacitance with sulfur dopant concentration:

TABLE I

| InGaAs Sulfur Dopant Levels | Leakage Current 10mV, 300K | Capacitance oV, 300K |
|---|---|---|
| $3-5 \times 10^{15} cm^{-3}$ | 200 nA | 50 pF |
| $1-5 \times 10^{17} cm^{-3}$ | 50 nA | 250 pF |

The reduction in leakage current is accompanied by an increase in capacitance, which may increase readout (KTc) noise. Adjustments of the doping level can be made to optimize the desired parameters. However, high KTc noise can be eliminated with correlated double sampling as well.

Even after the above depositions have been made, leakage current can be further reduced by thermal annealing. We have found that thermal cycling of the deposited layers on the InP substrate further reduces leakage current; the reduction in leakage current is believed to be the result of further reductions in the number of dislocations in the layers. The wafers are cycled between a temperature of about the vaporization temperature of arsenic (As), i.e., about 640° C., and a lower temperature, such as about 300°–400° C. The upper temperature limit is chosen to prevent evaporation of the As at higher temperatures. A lower temperature is chosen to result in a temperature cycling of the wafer. The exact temperatures and the rate of thermal cycling is not critical; the rate can vary from about 5 seconds to several minutes. The number of cycles is not believed to be critical either and can be adjusted depending on the amount of lattice mismatch between the layers. For example, a reduction in leakage current was obtained by cycling a wafer between a first temperature of 640° C. for one minute; reducing the temperature to 300°–400° C. for one minute; and repeating five times. One skilled in the art can vary these parameters to optimize preselected properties.

The following Table II illustrates the effects of thermal cycling on a 1.8 micron graded wafer with 500 micron detectors: slow cycling was done at intervals of 2–3 minutes, and rapid cycling was done at intervals of about 5 seconds.

TABLE II

| Wafer | Thermal Cycling | Leakage Current 10 mV, 300K |
|---|---|---|
| 1.8 | none | 200 nA |
| 1.8 | slow, prior to diffusion, 5 cycles, 1 min. each | 50–100 nA |
| 1.8 | rapid, prior to diffusion, 5 cycles, 1 min each | 50–100 nA |

Thus the leakage current of thermally cycled wafers was reduced by 2–4 times over that of non-thermally cycled wafers.

The invention will be further described by reference to the following Examples, but the invention is not meant to be limited to the details disclosed therein.

EXAMPLE 1

A 2.2 micron graded InGaAs/InAsP/InP photodetector was made as follows:

Using a high accuracy mass flow controller and hydride VPE techniques, $InAs_yP_{1-y}$ layers were grown on a (100) oriented InP substrate having a doping level of n-type S to a level of $1-5 \times 10^{17} cm^{-3}$ The composition of the successive layers is given below in Table III:

TABLE III

| As Concentration | Lattice Mismatch, % |
|---|---|
| y = 1.5% | 0.13 |
| y = 6.0% | |
| y = 10.5% | |
| y = 14.5% | |
| y = 19.0% | |
| y = 23.0% | |
| y = 27.5% | |
| y = 31.5% | |

Figure 3:
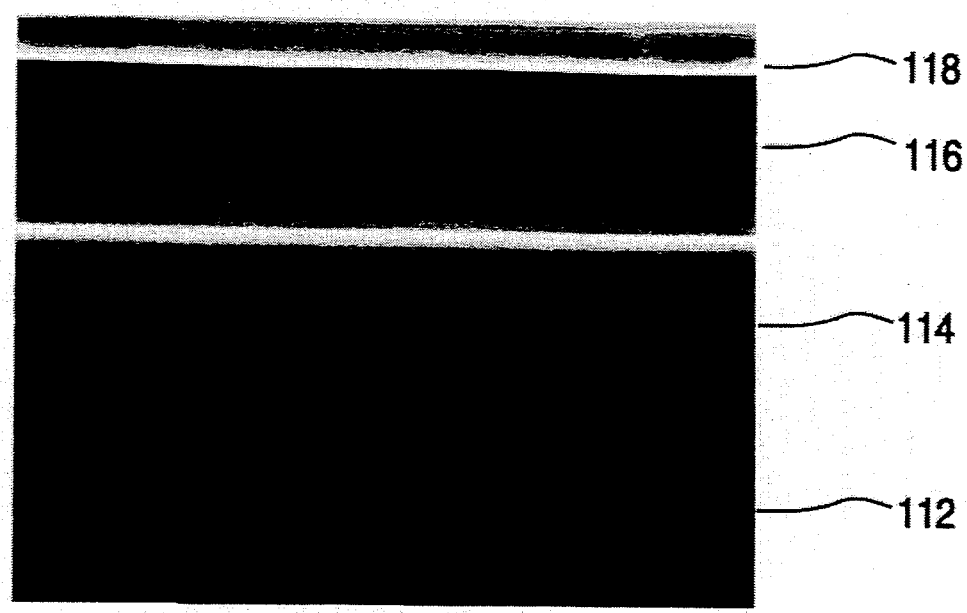
FIG. 3 is an SEM photomicrograph of a cross section of an InGaAs/InAsP/InP wafer of the invention.

An active layer of $In_{0.71}Ga_{0.29}As$ also doped with n-type S to a level of $1-5 \times 10^{17} cm^{-3}$ was deposited over the InAsP layer and a cap layer of $InAs_{0.36}P_{0.74}$ was deposited over the active layer. FIG. 3 is an SEM photomicrograph of a cross section of the wafer which clearly shows sharp and abrupt interfaces between the adjacent epitaxial layers.

To complete the array, a final silicon nitride passivation layer was deposited over the cap layer, zinc was diffused into the cap layer at 500° C. for 40 minutes and a bilevel contact of alloyed Au—Zn and Ti—Pt—Au was deposited to form the anode. The wafer was back lapped and polished, and back metallized with alloyed Au—Sn to form the other electrode. The wafer was then scribed into 512 element arrays.

Figure 4:
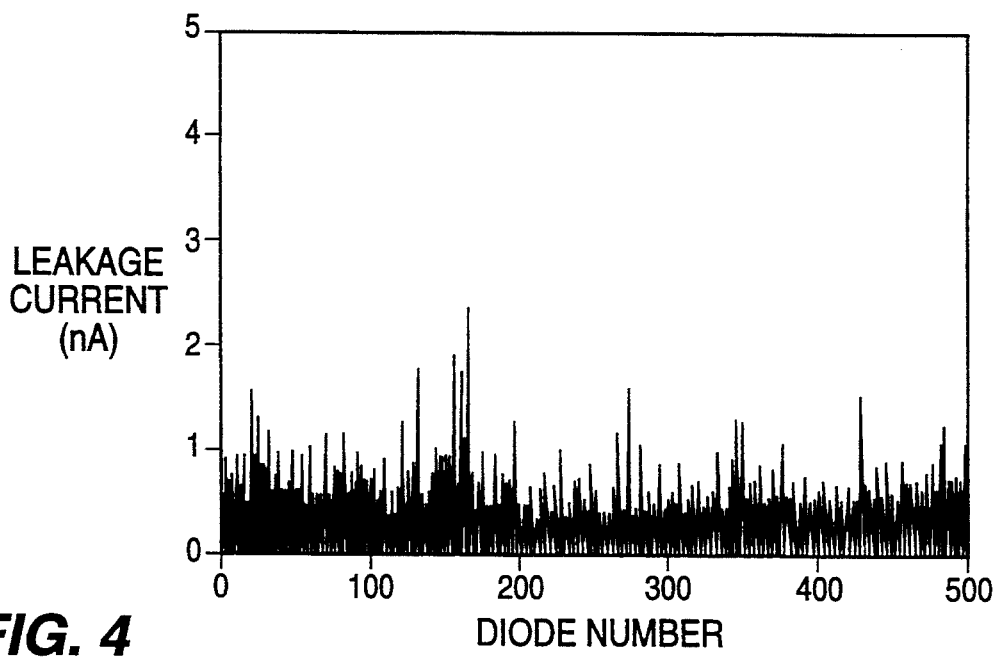
FIG. 4 is a graph of leakage current for a 512 element linear 2.2 micron InGaAs detector array of the invention.

FIG. 4 is a graph of leakage current of each of the elements in the array at a reverse bias of 10 mV and 300K.

Referring to FIG. 4, the average leakage current is 500 pA; only one diode exhibited leakage current in excess of 2 nA. Thus a high yield of low leakage current diodes was obtained. A 1024 element array can be made by butting together two 512 element arrays made as above.

Reliability testing was carried out at 125° C. and −1 V bias for many thousands of hours. Reliability was confirmed.

EXAMPLE 2

A 2.6 micron graded InGaAs/InAsP/InP photodetector was made as follows:

Using hydride VPE techniques, successive InAs$_y$P$_{1-y}$ layers were grown on a (100)−2° oriented InP substrate having a doping level of n-type S of $5 \times 10^{18}$ cm$^{-3}$. The InAsP layers were doped with n-type S to a level of $1-5 \times 10^{18}$ cm$^{-3}$. The composition of the successive layers is given below in Table IV.

TABLE IV

| As concentration | Lattice Mismatch, % |
|---|---|
| y = 1.5% | 0.13 |
| y = 6.0% | |
| y = 10.5% | |
| y = 14.5% | |
| y = 19.0% | |
| y = 23.0% | |
| y = 27.5% | |
| y = 31.5% | |
| y = 36.0% | |
| y = 40.5% | |
| y = 44.5% | |
| y = 49.0% | |
| y = 53.0% | |
| y = 57.5% | |
| y = 59.5% | |

Figure 5:
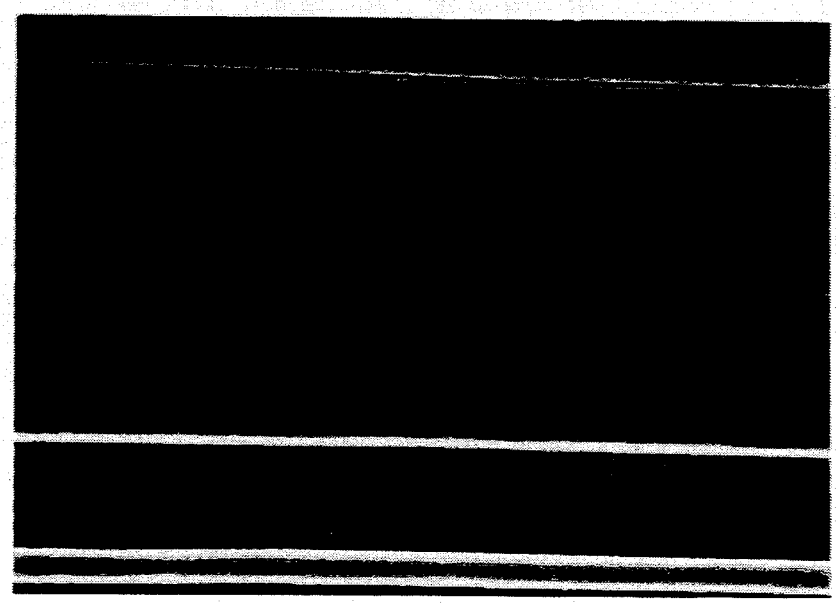
FIG. 5 is an SEM photomicrograph of a cross section view of a graded 2.6 micron InGaAs/InAsP/InP wafer of the invention.

An active layer of In$_{0.82}$Ga$_{0.18}$As, also doped with n-type S to a level of $1-5 \times 10^{17}$ cm$^{-3}$ was deposited over the InAsP layers and a cap layer of InAs$_{0.60}$P$_{0.40}$ doped with n-type S to a level of $1-5 \times 10^{16}$ cm$^{-3}$ was deposited over the active layer. FIG. 5 is an SEM photomicrograph of a cross section of the wafer which clearly shows sharp and abrupt interfaces between the adjacent epitaxial layers.

Figure 6A:
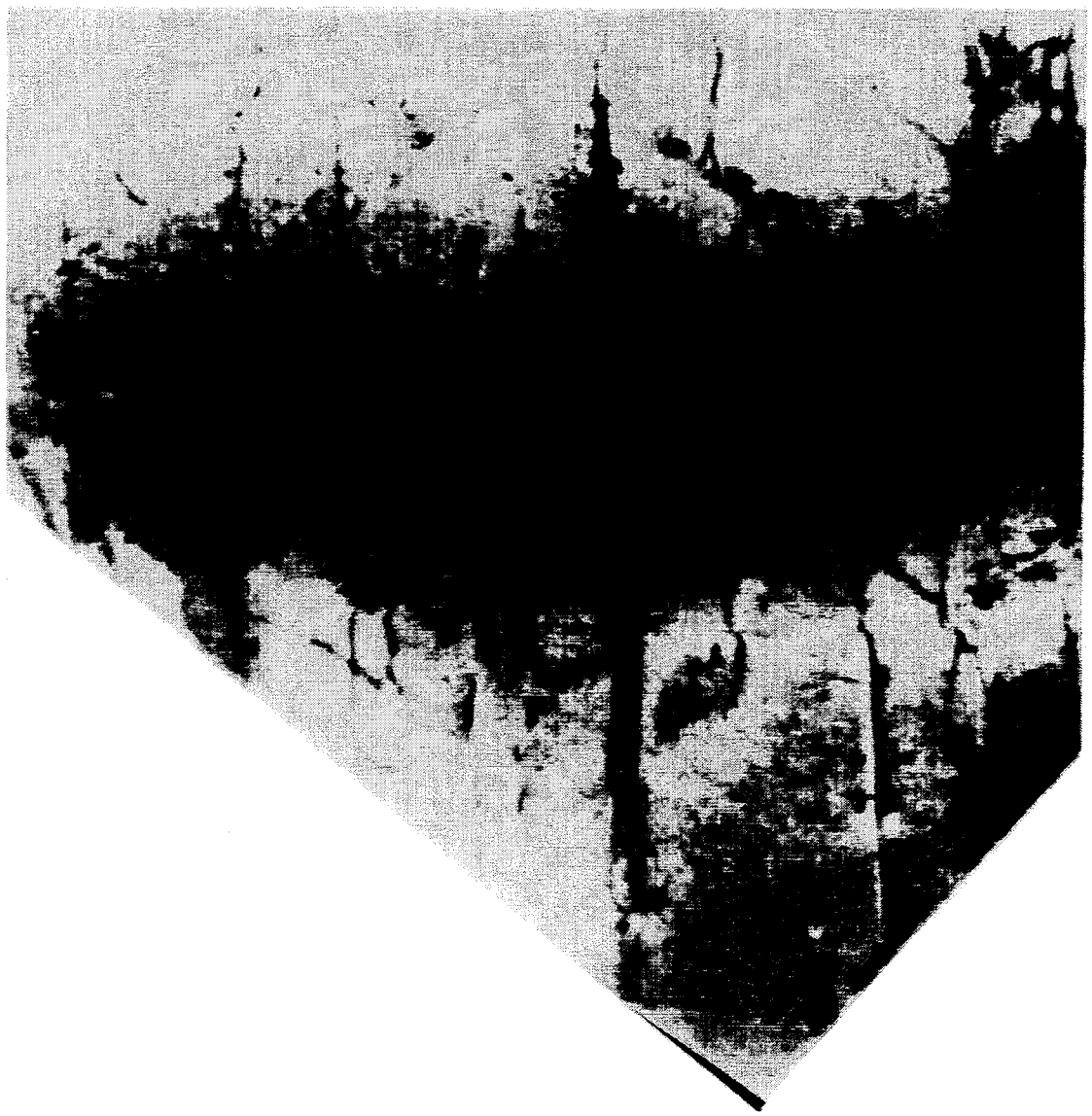
FIG. 6A and 6B are photomicrographs showing dislocation density before and after thermal cycling of a wafer of the invention.
Figure 6B:
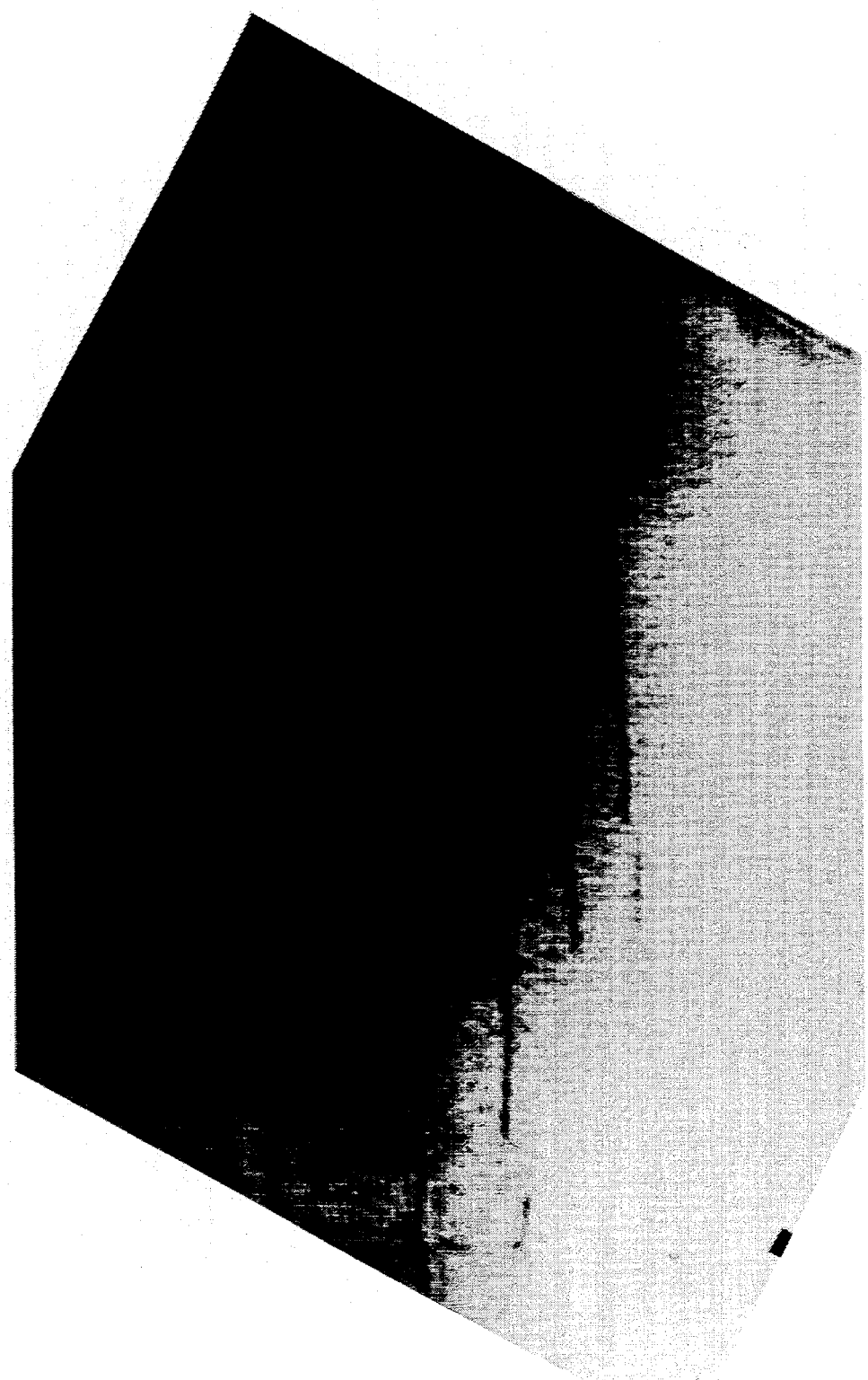

A final silicon nitride passivation layer was deposited over the cap layer, and the wafer subjected to a rapid thermal anneal for five minutes, cycling between 640° C. and 300° C. The thermal anneal reduces the number of dislocations and therefore reduces the leakage current. FIG. 6A is a photomicrograph of the unannealed wafer and FIG. 6B is a photomicrograph of the annealed wafer. It is apparent that the number of dislocations are greatly reduced after annealing.

To complete the array, zinc was diffused through the cap layer at 500° for 37 minutes; an Au—Zn and Ti—Pt—Au bilevel contact was deposited to form the anode. The wafer was then back lapped and an alloyed Au$_{0.8}$Sn$_{0.2}$ contact was made for the other, n-contact. The wafer was then scribed for 1024 element arrays.

Figure 7:
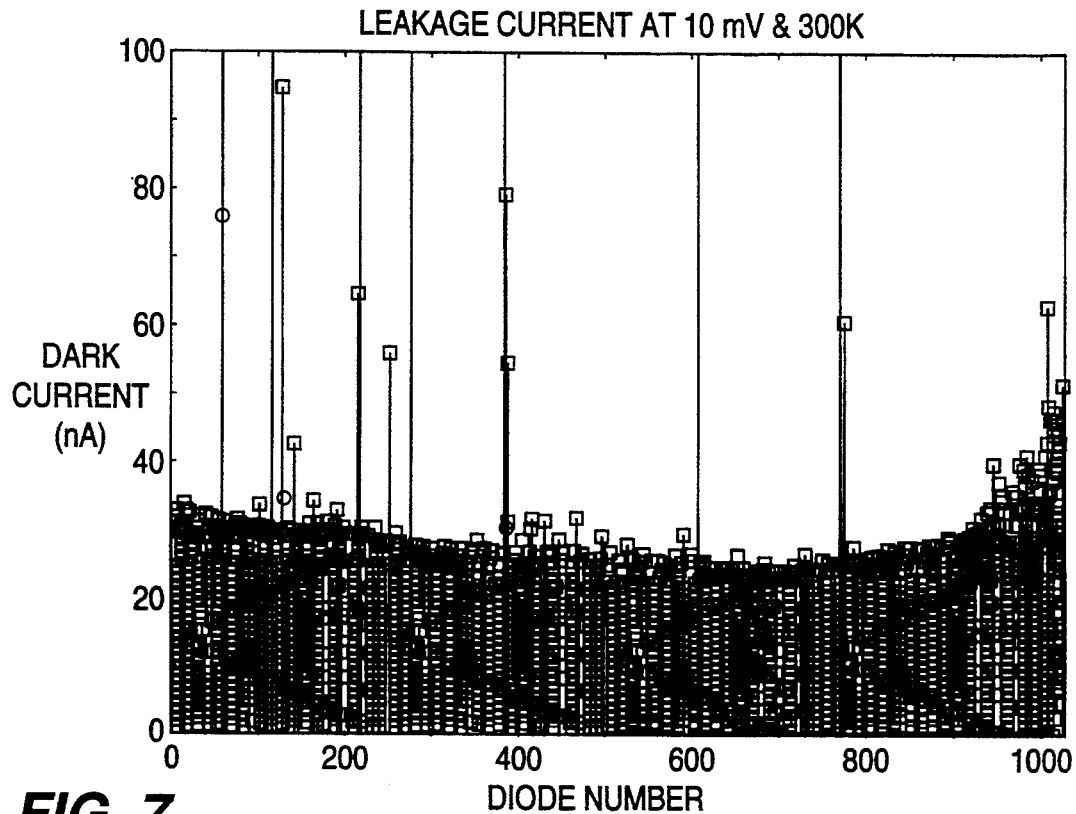
FIG. 7 is a graph of leakage current for a 1024 element 2.6 micron InGaAs photodetector of the invention.
Figure 8:
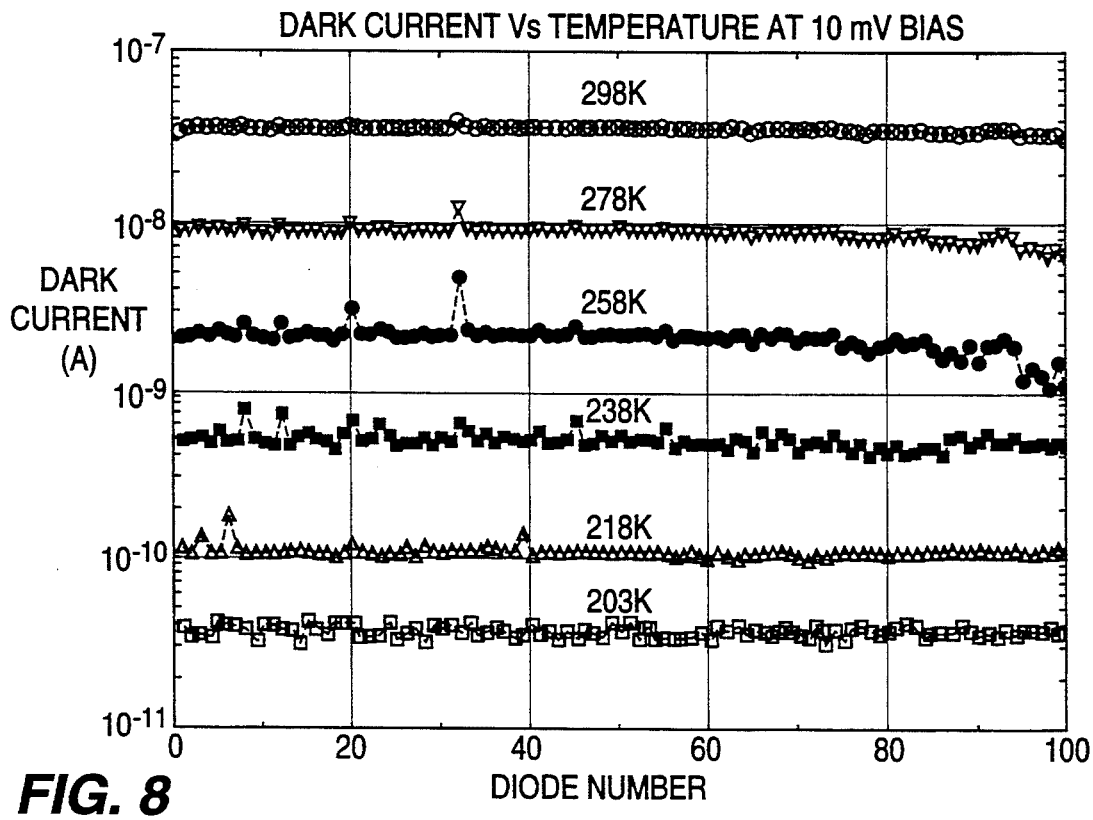
FIG. 8 is a graph of leakage current for 100 elements of a 2.6 micron photodetector of the invention at varying temperatures.

FIG. 7 is a graph of leakage current versus dark current of a 1024 elemental array at a reverse bias of 10 mV and 300K at room temperature. FIG. 8 is a graph of leakage current of 100 elements at different temperatures of from 203°-298° K.

It is apparent from FIG. 7 and FIG. 8 that the leakage current is very uniform at room temperature as well as at low temperatures. The usual leakage current uniformity requirement is within 10%, and the above 1024 element array meets this requirement. The number of bad elements is less than 1% from a single sliver, without the need for butting together two or more slivers to obtain a 1024 element array.

Figure 9:
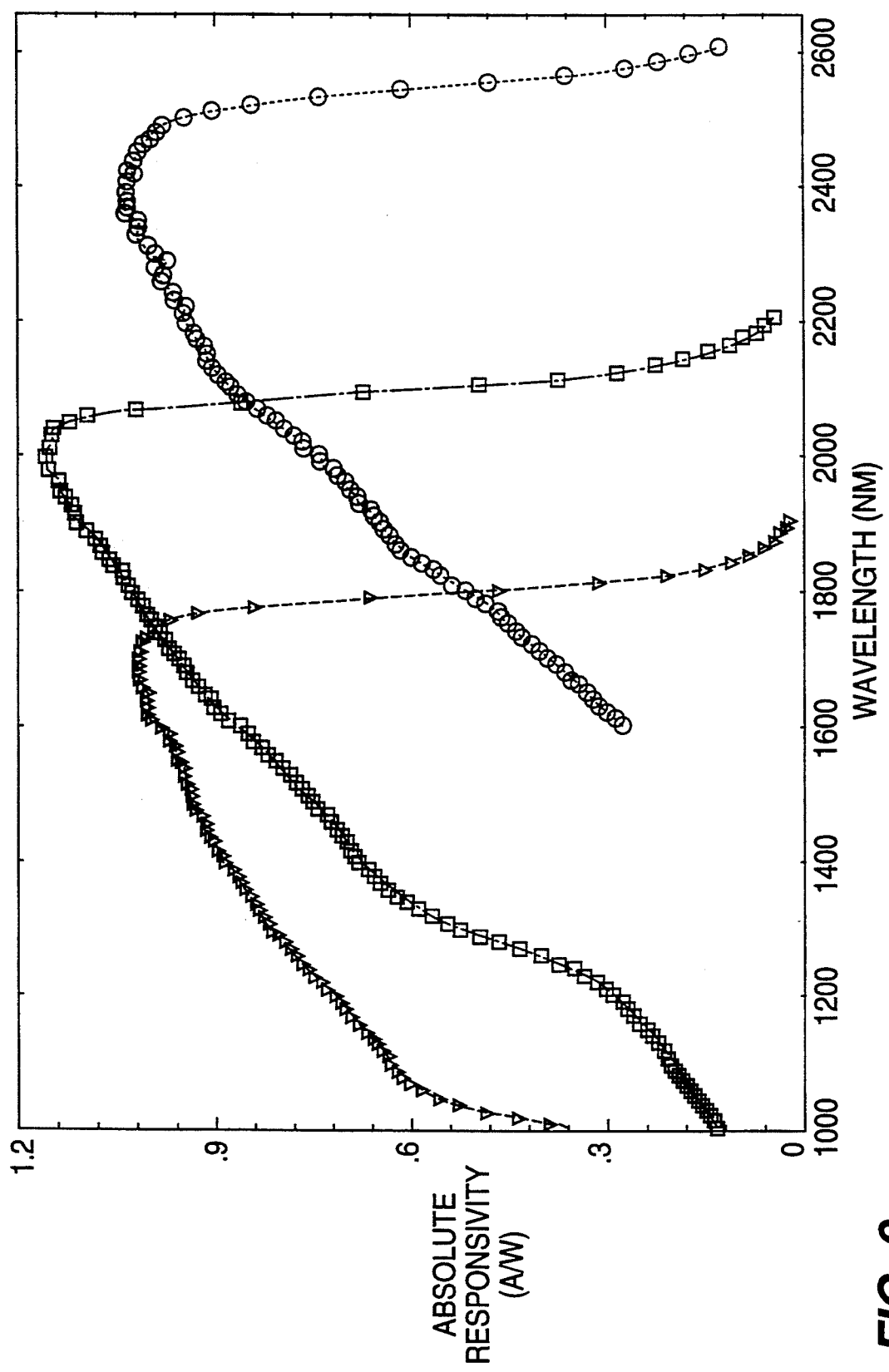
FIG. 9 is a graph of responsivity versus wavelength for photodetectors of the invention.

FIG. 9 is a graph of absolute responsivity (A/W) versus wavelength of a prior art photodetector (A); a photodetector of Example 1 optimized at 2.2 microns (B); and a photodetector of Example 2 optimized at 2.6 microns.

Although the invention has been described with respect to specific embodiments and examples, various changes can be made to the structure of the photodetector, substitution of different materials can be made and the like, which are meant to be included herein. The invention is only meant to be limited by the scope of the appended claims.

We claim:

1. A method of making InGa$_x$As$_{1-x}$In$_y$As/$_{1-y}$P/InP photodetectors comprising:
   a) depositing a plurality of compositionally graded InAs$_y$P$_{1-y}$ layers over an InP substrate by hydride vapor phase epitaxy so that there are abrupt interfaces between the layers, the composition of the graded InAs$_y$P$_{1-y}$ layers having a lattice mismatch between adjacent layers of 0.13% or less;
   b) depositing an InGa$_x$As$_{1-x}$ absorption layer doped with sulfur to a concentration of up to about $1-5 \times 10^{17}$ cm$^{-3}$; and
   c) thermal annealing of the resultant wafer by cycling between a temperature of about the vaporization temperature of arsenic and a lower temperature.

2. A method according to claim 1 wherein the InAsP layer is doped with sulfur to a level of up to $1-5 \times 10^{18}$ cm$^{-3}$.

3. A method according to claim 1 wherein the layer of InAsP adjacent to the substrate has an arsenic concentration of at least about 1.5%.

4. A method according to claim 3 wherein the arsenic concentration varies from about 1.5-59.5%.

5. A method according to claim 1 wherein the layer of InAsP adjacent to the InGaAs layer is closely lattice matched to the InGaAs layer.

6. A method according to claim 5 wherein the arsenic concentration varies from about 1.5-31.5%.

7. A method according to claim 1 wherein thermal cycling is carried out between about 640° C. and about 400° C.

8. A method according to claim 1 wherein thermal cycling is carried out between about 640° C. and about 300° C.

9. A method according to claim 8 wherein at least five thermal cycles are carried out.

10. A low leakage current In$_x$Ga$_{1-x}$As/InAs$_y$P$_{1-y}$/InP photodetector comprising compositionally graded layers of InAs$_y$P$_{1-y}$ wherein adjoining layers have abrupt interfaces and have a lattice mismatch of 0.13% or less; the In$_x$Ga$_{1-x}$As layer has a composition wherein x is from about 0.53-0.82 and an n-type sulfur dopant concentration of up to about $1-5 \times 10^{17}$ cm$^{-3}$.

11. A low leakage current photodectector according to claim 10 wherein the InAsP layer is doped with sulfur to a level of up to $1-5 \times 10^{18}$ cm$^{-3}$.

12. A low leakage current photodetector according to claim 10 wherein the InAs$_y$P$_{1-y}$ layer adjacent to the InP substrate has a composition wherein y=0.015.

13. A low leakage current photodetector according to claim 10 wherein said graded InAs$_y$P$_{1-y}$ compositions vary from y=0.015 to y=0.315.

14. A low leakage current photodetector according to claim 13 wherein the lattice mismatch between successive layers is maintained at 0.10% or less.

15. A low leakage current photodetector according to claim 10 wherein said graded InAs$_y$P$_{1-y}$ compositions vary from y=0.015 to y=0.595.

* * * * *